(12) United States Patent
Weaver et al.

(10) Patent No.: US 9,281,222 B2
(45) Date of Patent: Mar. 8, 2016

(54) WAFER HANDLING SYSTEMS AND METHODS

(71) Applicant: Applied Materials, Inc., Santa Clara, CA (US)

(72) Inventors: William Tyler Weaver, Austin, TX (US); Malcolm N. Daniel, Jr., Austin, TX (US); Robert B. Vopat, Austin, TX (US); Jason M. Schaller, Austin, TX (US); Jacob Newman, Palo Alto, CA (US); Dinesh Kanawade, Sunnyvale, CA (US); Andrew J. Constant, Cupertino, CA (US); Stephen C. Hickerson, Hollister, CA (US); Jeffrey C. Hudgens, San Francisco, CA (US); Marvin L. Freeman, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 106 days.

(21) Appl. No.: 14/203,237

(22) Filed: Mar. 10, 2014

(65) Prior Publication Data

US 2014/0271050 A1 Sep. 18, 2014

Related U.S. Application Data

(60) Provisional application No. 61/787,294, filed on Mar. 15, 2013.

(51) Int. Cl.
*H01L 21/67* (2006.01)
*H01L 21/677* (2006.01)

(52) U.S. Cl.
CPC .... *H01L 21/67196* (2013.01); *H01L 21/67742* (2013.01)

(58) Field of Classification Search
CPC ................... H01L 21/67742; H01L 21/67745; H01L 21/67748
USPC ................................... 414/217, 744.2, 226.05
See application file for complete search history.

(56) References Cited

U.S. PATENT DOCUMENTS

| | | | | |
|---|---|---|---|---|
| 5,147,175 A | * | 9/1992 | Tada ......................... | B25J 9/107 414/744.5 |
| 5,151,008 A | * | 9/1992 | Ishida .................... | B25J 9/0084 414/744.5 |

(Continued)

OTHER PUBLICATIONS

Weaver et al., U.S. Appl. No. 14/211,049, titled: "Substrate Deposition Systems, Robot Transfer Apparatus, and Methods for Electronic Device Manufacturing," filed Mar. 14, 2014.

(Continued)

*Primary Examiner* — Kaitlin Joerger
(74) *Attorney, Agent, or Firm* — Dugan & Dugan, PC

(57) ABSTRACT

A wafer handling system may include upper and lower linked robot arms that may move a wafer along a nonlinear trajectory between chambers of a semiconductor processing system. These features may result in a smaller footprint in which the semiconductor processing system may operate, smaller transfer chambers, smaller openings in process chambers, and smaller slit valves, while maintaining high wafer throughput. In some embodiments, simultaneous fast wafer swaps between two separate chambers, such as load locks and ALD (atomic layer deposition) carousels, may be provided. Methods of wafer handling are also provided, as are other aspects.

20 Claims, 9 Drawing Sheets

(56) References Cited

U.S. PATENT DOCUMENTS

| | | | |
|---|---|---|---|
| 5,951,770 | A | 9/1999 | Perlov et al. |
| 6,575,737 | B1 | 6/2003 | Perlov et al. |
| 7,874,781 | B2* | 1/2011 | Nozawa ............ H01L 21/67167 414/217 |
| 7,946,800 | B2* | 5/2011 | Hosek ................... B25J 9/042 414/744.5 |
| 8,434,992 | B2* | 5/2013 | Tara ..................... B25J 9/042 414/744.3 |
| 8,768,513 | B2* | 7/2014 | Cox ...................... H01L 21/68 700/1 |
| 8,961,099 | B2* | 2/2015 | Blank .................. B25J 18/04 414/744.5 |
| 9,076,829 | B2* | 7/2015 | Brodine ............ H01L 21/67742 |
| 2005/0079043 | A1* | 4/2005 | Ogawa ................. B25J 9/1065 414/744.2 |
| 2005/0111956 | A1* | 5/2005 | van der Meulen ....... B25J 9/042 414/744.2 |
| 2009/0024241 | A1 | 1/2009 | Rice et al. |
| 2009/0182454 | A1 | 7/2009 | Donoso et al. |
| 2010/0019431 | A1 | 1/2010 | Leo et al. |
| 2011/0135437 | A1* | 6/2011 | Takeshita ............... B25J 9/042 414/744.5 |
| 2013/0039726 | A1 | 2/2013 | Brodine et al. |
| 2013/0039734 | A1* | 2/2013 | Englhardt ......... H01L 21/67115 414/806 |
| 2013/0041505 | A1 | 2/2013 | Cox |
| 2013/0149076 | A1* | 6/2013 | Cox ...................... B65G 49/00 414/217 |
| 2013/0272823 | A1* | 10/2013 | Hudgens ........... H01L 21/67742 414/217 |
| 2014/0064886 | A1* | 3/2014 | Toshima ................ H01L 21/677 414/221 |
| 2014/0133942 | A1* | 5/2014 | Furuichi ........... H01L 21/67766 414/226.05 |
| 2014/0154033 | A1* | 6/2014 | Blank .................... B25J 9/042 414/217 |
| 2014/0271050 | A1* | 9/2014 | Weaver ............. H01L 21/67742 414/217 |

OTHER PUBLICATIONS

Weaver et al., U.S. Appl. No. 14/211,123, titled: "Multi-Position Batch Load Lock Apparatus and Systems and Methods Including Same," filed Mar. 14, 2014.

Weaver et al., U.S. Appl. No. 14/212,665, titled: "Temperature Control Systems and Methods for Small Batch Substrate Handling Systems," filed Mar. 14, 2014.

\* cited by examiner

WAFER HANDLING SYSTEMS AND METHODS

CROSS REFERENCE TO RELATED APPLICATION

This claims priority to U.S. Provisional Patent Application No. 61/787,294, filed Mar. 15, 2013, and titled "Wafer Handling Systems And Methods", which is hereby incorporated by reference herein in its entirety for all purposes.

FIELD

The invention relates generally to semiconductor device manufacturing, and more particularly to wafer handling systems and methods.

BACKGROUND

Within a semiconductor device manufacturing process, a wafer handling system may move multiple wafers into and out of various chambers to undergo processing. Some known wafer handling systems, which may be capable of transferring wafers through a manufacturing process at a high throughput, may require a large footprint in which to operate. This may increase the space required for a manufacturing process and, thus, the cost of manufacture. Accordingly, a need exists for improved wafer handling systems and methods that have high wafer throughput yet a small footprint.

SUMMARY

According to one aspect, a wafer handling system is provided. The wafer handling system comprises a robot including a first arm having a first length and a second arm having a second length greater than the first length and less than twice the first length, wherein the robot is configured to move a wafer such that the center of the wafer moves along a nonlinear trajectory.

According to another aspect, a semiconductor processing system is provided. The semiconductor processing system comprises a first chamber configured to receive one or more wafers; a second chamber configured to receive one or more wafers; and a robot located between the first chamber and the second chamber, the robot including a first arm having a first length and a second arm having a second length greater than the first length and less than twice the first length; wherein the robot is configured to move a wafer to or from the first chamber and from or to the second chamber such that the center of the wafer moves along a nonlinear trajectory between the first chamber and the second chamber.

According to a further aspect, a method of transferring wafers in a semiconductor processing system is provided. The method comprises providing a robot configured to transfer a first wafer, the robot comprising a first arm coupled to a second arm, wherein the first arm has a first length and the second arm has a second length greater than the first length and less than twice the first length; and moving the first wafer with the robot such that the center of the first wafer moves along a nonlinear trajectory.

Still other aspects, features, and advantages of the invention may be readily apparent from the following detailed description wherein a number of example embodiments and implementations are described and illustrated, including the best mode contemplated for carrying out the invention. The invention may also include other and different embodiments, and its several details may be modified in various respects, all without departing from the scope of the invention. Accordingly, the drawings and descriptions are to be regarded as illustrative in nature, and not as restrictive. The invention covers all modifications, equivalents, and alternatives falling within the scope of the invention.

BRIEF DESCRIPTION OF THE DRAWINGS

The skilled artisan will understand that the drawings, described below, are for illustrative purposes only. The drawings are not necessarily drawn to scale and are not intended to limit the scope of this disclosure in any way.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts.

Wafer handling systems and methods may be configured to transfer wafers into and out of one or more chambers in a semiconductor processing system. The chambers may be, e.g., processing chambers, transfer chambers, and/or load lock chambers. The processing chambers may include, e.g., an ALD (atomic layer deposition) chamber. In one aspect, a wafer handling system may include a robot having a first arm and a second arm. The first arm may have a first length, and the second arm may have a second length greater than the first length and less than twice the first length. These relative arm lengths may allow the robot to move a wafer from one chamber to another such that the center of the wafer moves along a nonlinear trajectory. This may allow the wafer handling system to have a smaller footprint and use smaller interfaces between the chambers than some known wafer handling systems, while maintaining about the same wafer throughput as those known wafer handling systems. In other aspects, methods of transferring wafers in a semiconductor processing system are provided, as will be explained in greater detail below in connection with FIGS. 1-8.

Figure 1:
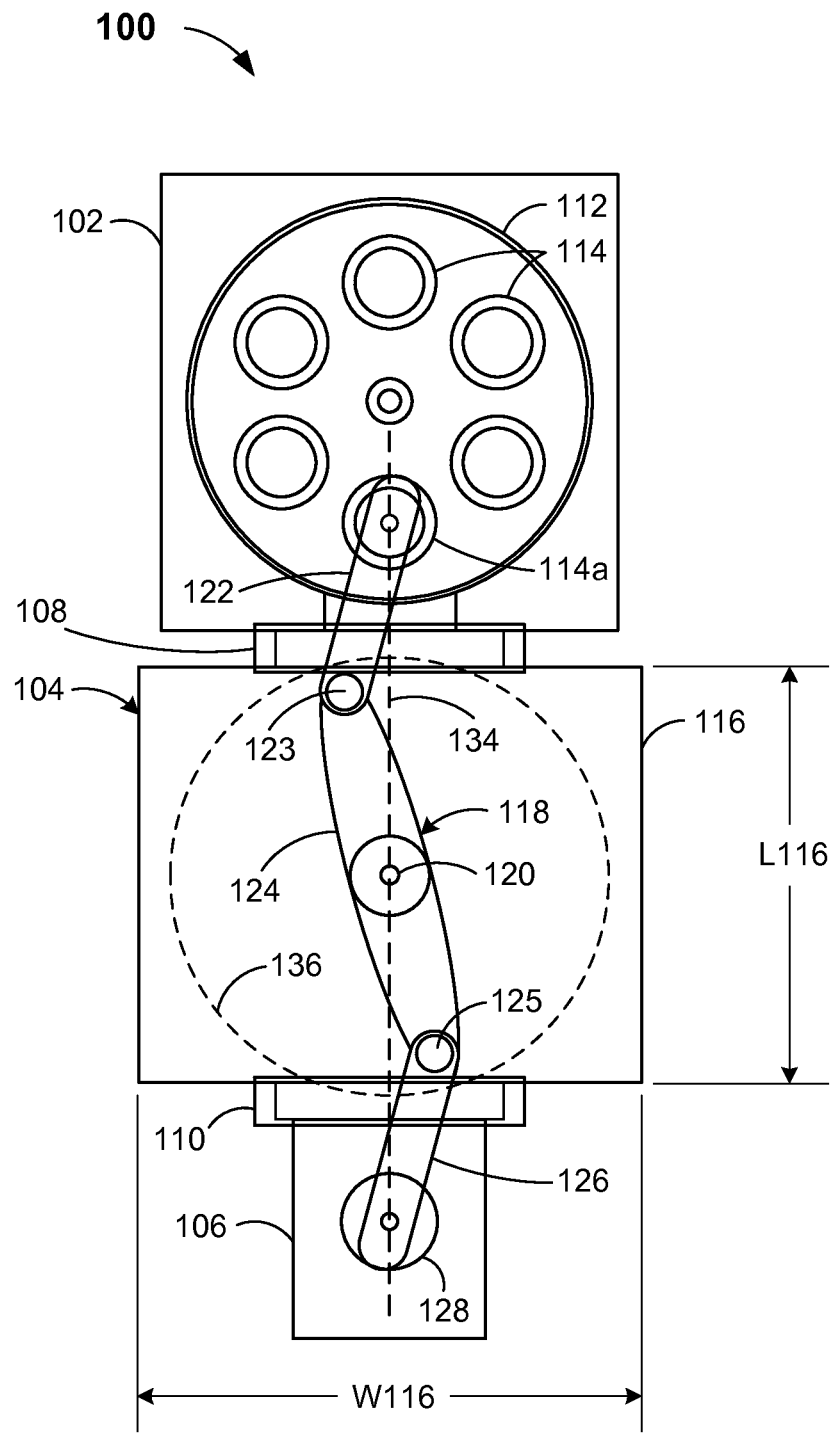
FIG. 1 illustrates a schematic top view of a semiconductor processing system according to the prior art.

FIG. 1 illustrates a semiconductor processing system 100 that may include a processing chamber 102, a known wafer handling system 104, and a load lock chamber 106. A slit valve 108 or similar device may couple processing chamber 102 to wafer handling system 104 to allow a wafer to be transferred there between. A slit valve 110 or similar device may couple load lock chamber 106 to wafer handling system 104 to allow a wafer to be transferred there between. Processing chamber 102 may be a batch processing chamber, such as, e.g., an ALD (atomic layer deposition) processing chamber that may have a rotatable multi-wafer carousel 112. Multi-wafer carousel 112 may have, e.g., up to six wafer positions 114 (two are labeled). Processing chamber 102 may have other arrangements and/or numbers of wafer positions. Load lock chamber 106 may be configured to receive one or more wafers. In other embodiments, semiconductor processing system 100 may alternatively or additionally include other types of chambers coupled to wafer handling system 104.

Wafer handling system 104 may include a transfer chamber 116 and a single-axis wafer transfer robot 118 that may rotate about center axis 120 (which extends into and out of the page as shown in FIG. 1). Robot 118 may include a first arm 122, a second arm 124, and a third arm 126. First arm 122 and third arm 126 may each be upper arms (at different heights with respect to each other), while second arm 124 may be a lower arm. First arm 122 may be rotatably coupled to a first end 123 of second arm 124, while third arm 126 may be rotatably coupled to a second end 125 of second arm 124. First arm 122 and third arm 126 may be rotatably coupled to second arm 124 in any suitable manner. First arm 122 and third arm 126 may each be configured to carry a wafer, such as wafer 128. Wafer 128 may be, e.g., a 300 mm wafer. Robot 118 may be configured to concurrently exchange a pair of wafers between the same two chambers. For example, robot 118 may be configured to concurrently swap the positions of one wafer at wafer position 114a in processing chamber 102 and another wafer in load lock chamber 106.

Figure 2:
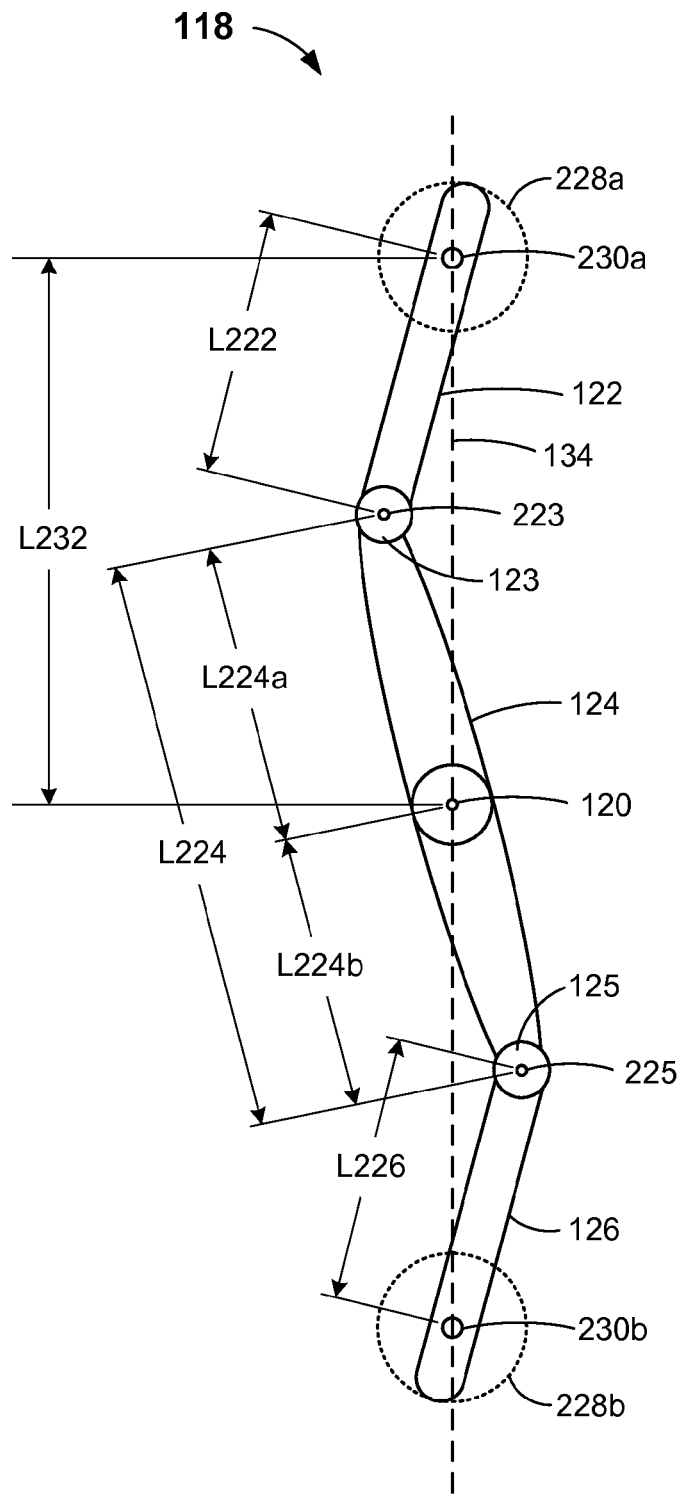
FIG. 2 illustrates a schematic top view of a wafer transfer robot according to the prior art.

FIG. 2 illustrates the geometry of robot 118 with respect to first arm 122, second arm 124, and third arm 126 relative to one another. First arm 122 may have a length L222 defined as the linear distance between the center 230a of a wafer 228a (shown in phantom) carried by first arm 122 and an axis of rotation 223 at first end 123. In some embodiments, length L222 may be, e.g., about 457.2 mm (about 18 inches). First arm 122 may have other lengths. Third arm 126 may have a length L226 defined as the linear distance between an axis of rotation 225 at second end 125 and the center 230b of a wafer 228b (shown in phantom) carried by third arm 126. Length L226 may be equal to length L222. Second arm 124 may have a length L224 that may be twice the length of first arm 122 and/or third arm 126. That is, length L224 may be twice length L222 and/or twice length L226, wherein length L224 may be defined as the linear distance between axis of rotation 223 and axis of rotation 225. For example, in those embodiments where length L222 and/or length L226 are each about 457.2 mm (about 18 inches), length L224 may be about 914.4 mm (about 36 inches). Furthermore, length L224 may be the sum of a length L224a and a length L224b, wherein length L224a may be defined as the linear distance between axis of rotation 223 and center axis 120, and length L224b may be defined as the linear distance between center axis 120 and axis of rotation 225. Lengths L224a and L224b may each be equal to length L222 and/or length L226. Robot 118 may be referred to as a "symmetric swapbot."

In some embodiments, robot 118 may have a length L232 defined as its "reach," which may be a nominal distance measured linearly from center axis 120 (which may typically be located at the center of transfer chamber 116) to a center of a wafer positioned in a chamber serviced by robot 118, such as, e.g., center 230a of a wafer 228a, which may be located in, e.g., processing chamber 102 at wafer position 114a. A robot's reach may be derived from a number of system variables such as wafer size, chamber depth, and arm lengths. Robot 118's reach may also be a nominal distance measured linearly from center axis 120 to center 230b of a wafer 228b, which may be located in, e.g., load lock chamber 106. This nominal distance may be the same length as L232. In some embodiments, length L232 may be about 903.3 mm (about 35.6 inches). In other embodiments, robot 118 may have a reach of other suitable lengths.

Figure 3A:
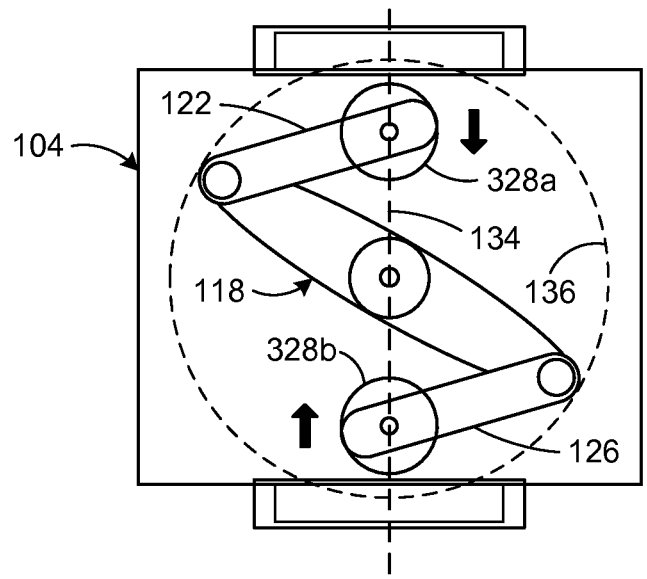
FIGS. 3A-3B illustrate schematic top views of a motion trajectory of the wafer transfer robot of FIG. 2 according to the prior art.
Figure 3B:
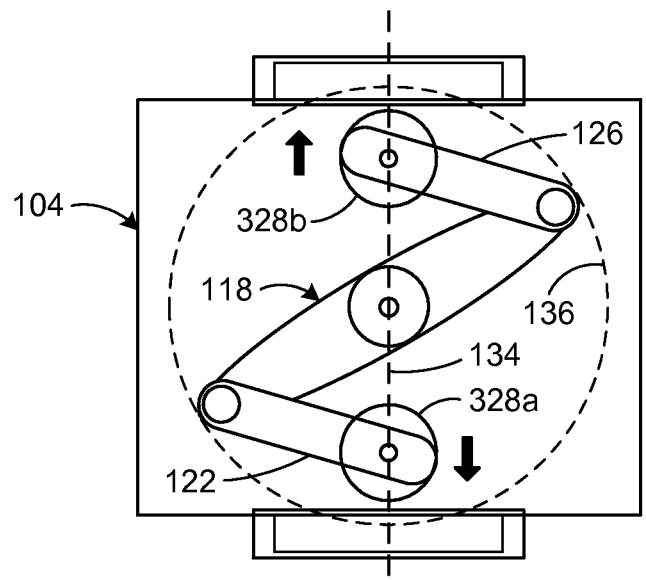

The configuration of robot 118 may move the center of wafer 328a carried by first arm 122 and the center of wafer 328b carried by third arm 126 along a same linear (i.e., straight line) trajectory 134, as illustrated in FIGS. 3A and 3B. Wafer 328a may move downward along trajectory 134 while wafer 328b may move concurrently upward along trajectory 134. Note that first arm 122 may be configured higher or lower than third arm 126 such that wafers 328a and 328b may pass each other along trajectory 134 without interfering with each other.

Although wafer handling system 104 may be able to exchange wafers fairly quickly to and from a batch process chamber (such as, e.g., ALD carousel 112 as shown in FIG. 1), use of wafer handling system 104 in some semiconductor processing systems may increase the overall footprint of the system tool, and, in particular, a size of transfer chamber 116, and may require larger chamber openings, larger slit valves, different lift pin arrangements, and the like. Also, standard 300 mm interfaces used on other tools may not be usable with wafer handling system 104. These disadvantages may be attributed to the symmetric layout of robot 118. That is, the symmetric configuration of equal length upper arms (e.g., first arm 122 and third arm 126) and a lower arm (e.g., second arm 124) twice the length of the upper arms may cause the symmetric swapbot to sweep out during wafer exchanges along an envelope 136 having a fairly large volume. This may cause an increase in footprint as well as a rendering of standard 300 mm interfaces and standard designs unusable. Increasing the footprint and departing from existing 300 mm platforms and standards may not be desirable or possible in some semiconductor processing systems.

Wafer handling systems and methods in accordance with one or more embodiments maintain high wafer throughput (e.g., fast swap time of a batch of wafers) without one or more of the aforementioned disadvantages (e.g., increased footprint, departure from standard 300 mm interfaces, or the like) of known wafer handling systems. In some embodiments, an asymmetrically configured robot, which may be referred to as an "asymmetric swapbot," may have upper arms that are elongated in comparison to the corresponding upper arms of the known symmetric swapbot, and may have a shorter lower arm than the corresponding longer lower arm of the symmetric swapbot. Furthermore, the asymmetric swapbot may not drive the wafer center trajectory along a straight line. In addition to the geometry changes of the asymmetric swapbot, the motion trajectories may be optimized to allow a small footprint and standard 300 mm interfaces to be used without reducing wafer throughput.

Furthermore, some wafer processes may require that no rotating mechanism, mechanical joint, or the like of a robot enter a process chamber to limit the possibility of particle contamination. In these wafer processes, only a wafer-carrying end effector (sometimes referred to as a "blade") may enter a process chamber. The known symmetric swapbot has a fixed ratio between the lengths of the upper arms and the lower arm (1L for the upper arm and 2L for the lower arm). This ratio, the straight line trajectory, and the requirement that no rotating mechanism or mechanical joint of a robot enter a process chamber, may also cause the footprint of a wafer handling system having a symmetric swapbot to be relatively large. An asymmetric swapbot may abide by the fixed ratio or straight line requirements and may abide by the no mechanical joint in the process chamber requirement. Increasing the upper arm length without increasing the lower arm length and allowing the wafer to deviate from a pure straight line trajectory, such as when moving from a load lock chamber to the ALD carousel opening, again may allow the asymmetric swapbot to achieve a much smaller system footprint, use standard 300 mm openings and slit valves, and maintain the same wafer throughput.

Figure 4:
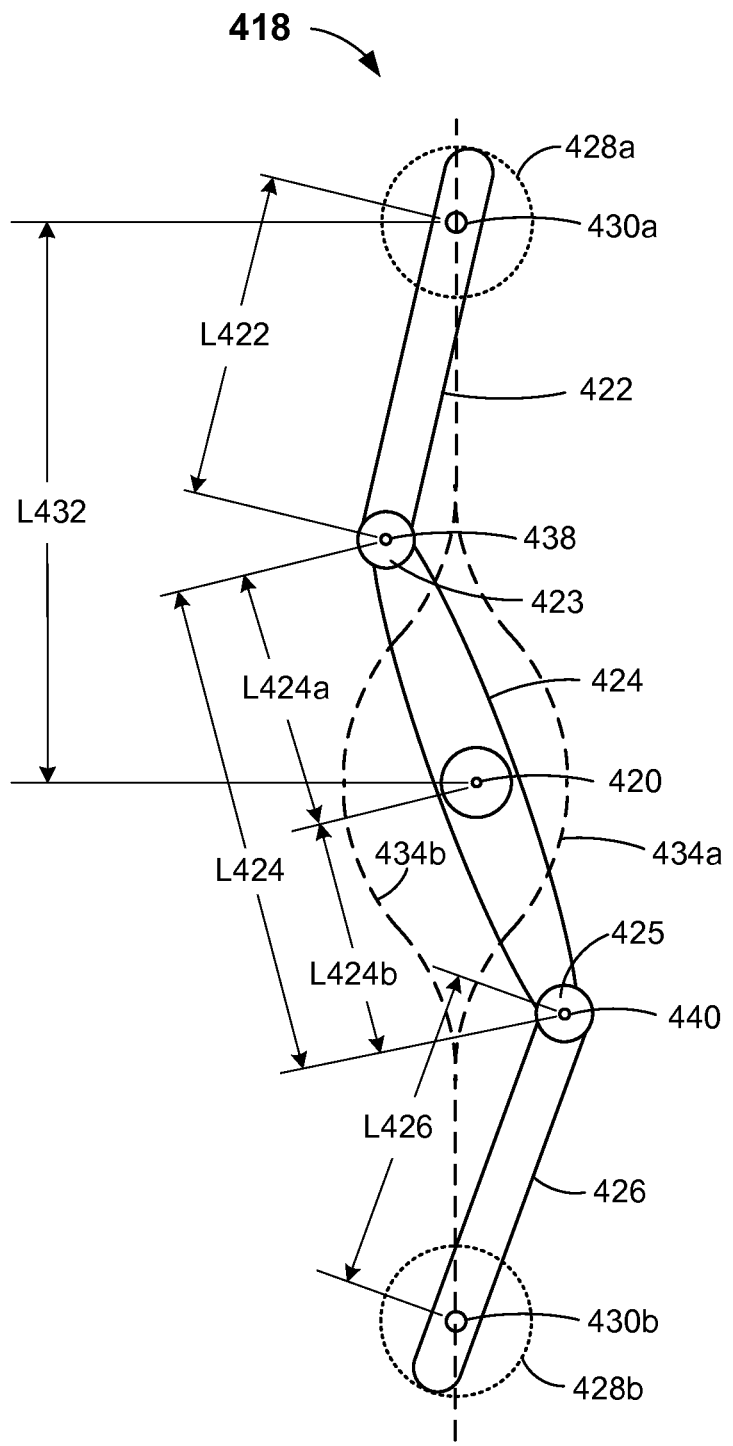
FIG. 4 illustrates a schematic top view of a wafer transfer robot according to embodiments.

FIG. 4 illustrates the geometry of a single-axis wafer transfer robot 418 in accordance with one or more embodiments. Robot 418 may rotate about a center axis 420 (which extends into and out of the page as shown in FIG. 4) and may be referred to as an asymmetric swapbot. Robot 418 may have a first arm 422, a second arm 424, and a third arm 426. First arm 422 and third arm 426 may each be upper arms (at different heights with respect to each other), while second arm 424 may be a lower arm. In some embodiments, second arm 424 may instead be an upper arm while first arm 422 and third arm 426 may each be lower arms (at different heights with respect to each other). First arm 422 may be rotatably coupled to a first end 423 of second arm 424, while third arm 426 may be rotatably coupled to a second end 425 of second arm 424. First arm 422 and third arm 426 may be rotatably coupled to second arm 424 in any suitable manner. First arm 422 and third arm 426 may each be configured to carry a wafer, such as respective wafers 428a and 428b (shown in phantom). Wafers 428a and 428b may each be, e.g., a 300 mm wafer.

First arm 422 may have a length L422 defined as the linear distance between the center 430a of wafer 428a carried by first arm 422 and an axis of rotation 438 at first end 423. In some embodiments, length L422 may be, e.g., about 533.4 mm (about 21 inches), which may be about 76.2 mm (about 3 inches) longer than first arm 122 of robot 118 described above. First arm 422 may have other suitable lengths. Third arm 426 may have a length L426 defined as the linear distance between an axis of rotation 440 at second end 425 and the center 430b of wafer 428b carried by third arm 426. Length L426 may be equal to length L422 in some embodiments. Second arm 424 may have a length L424 that may be defined as the linear distance between axis of rotation 438 and axis of rotation 440. Length L424 may be the sum of a length L424a and a length L424b, wherein length L224a may be defined as the linear distance between axis of rotation 438 and center axis 420, and length L424b may be defined as the linear distance between center axis 420 and axis of rotation 440. Length L424 may be greater than length L422 of first arm 422 and less than twice length L422. Length L424 may also, or alternatively, be greater than length L426 of third arm 426 and less than twice length L426. In some embodiments, lengths L424a and L424b may each be, e.g., about 381 mm (about 15 inches), and length L424 may be, e.g., about 762 mm (about 30 inches), which may be about 152.4 mm (about 6 inches) shorter than second arm 124 of robot 118 described above. Second arm 424 may have other suitable lengths L424, L424a, and/or L424b, provided that length L424 is greater than length L422 and/or length L426 and less than twice length L422 and/or length L426.

Robot 418 may have a length L432 defined as its "reach" that may, in some embodiments, be the same as robot 118's reach (i.e., length L232), even though the lengths of first arm 422, second arm 424, and third arm 426 are each different than respective first arm 122, second arm 124, and third arm 126. Thus, the changes in the relative lengths of the arms of a robot as described herein may not necessarily result in a change in a robot's reach. Length L432 may be a nominal distance measured linearly from center axis 420 (which may typically be located at the center of a transfer chamber) to a center of a wafer positioned in a chamber serviced by robot 418, such as, e.g., center 430a of wafer 428a, which may be located in, e.g., processing chamber 102 at wafer position 114a. Robot 418's reach may also be a nominal distance measured linearly from center axis 420 to center 430b of wafer 428b, which may be located in, e.g., load lock chamber 106. This nominal distance may be the same length as L432. In some embodiments, length L432 may be about 903.3 mm (about 35.6 inches). In other embodiments, robot 418 may have a reach of other suitable lengths.

As a result of the relative lengths of first arm 422, second arm 424, and third arm 426, robot 418 may be configured to move center 430a of wafer 428a carried by first arm 422 along a first nonlinear trajectory 434a, and/or center 430b of wafer 428b carried by third arm 426 along a second nonlinear trajectory 434b, as described in more detail below in connection with FIGS. 5-7. These nonlinear trajectories may allow robot 418 to be used with smaller slit valves and smaller chamber openings and to operate within a smaller transfer chamber, which may result in a smaller semiconductor processing system footprint, than robot 118, while maintaining the same or substantially the same high wafer throughput as that of robot 118.

Figure 5:
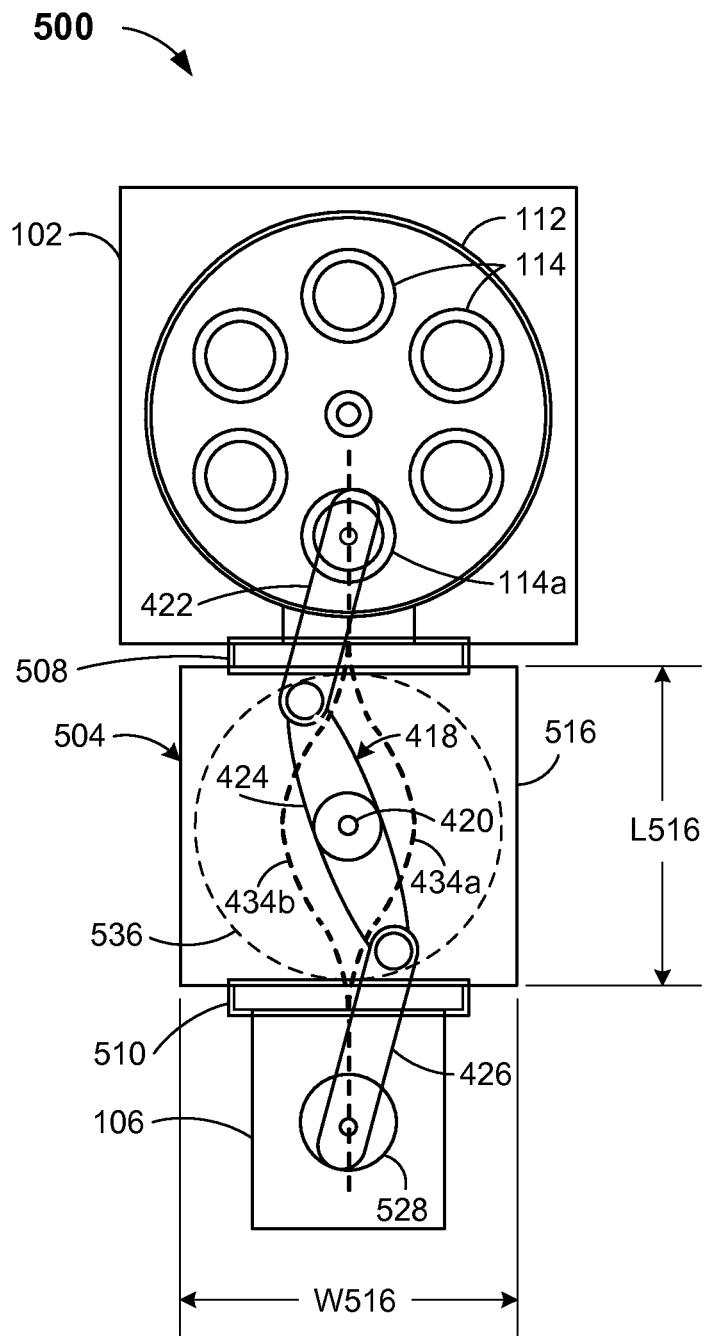
FIG. 5 illustrates a schematic top view of a semiconductor processing system having the wafer transfer robot of FIG. 4 according to embodiments.
Figure 6A:
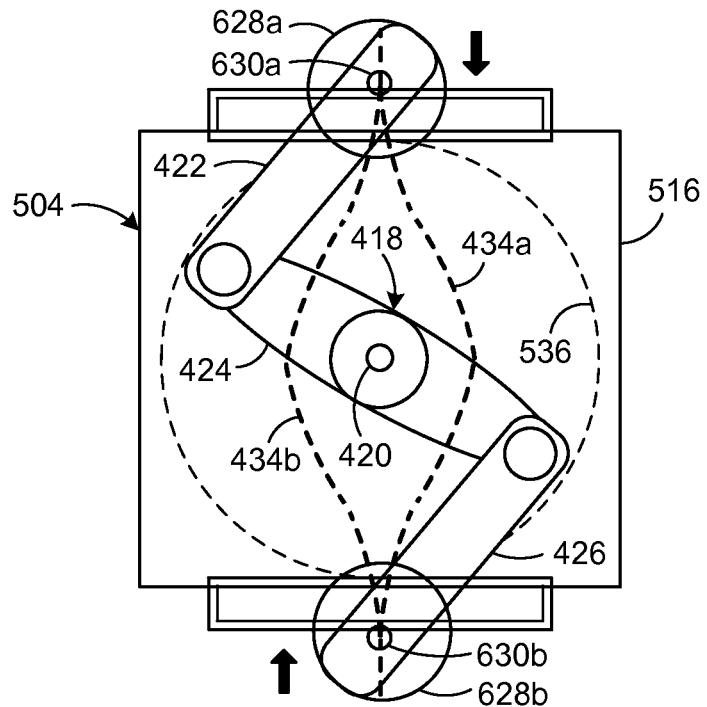
FIGS. 6A-6D illustrate schematic top views of the motion trajectories of the wafer transfer robot of FIG. 4 according to embodiments.
Figure 6B:
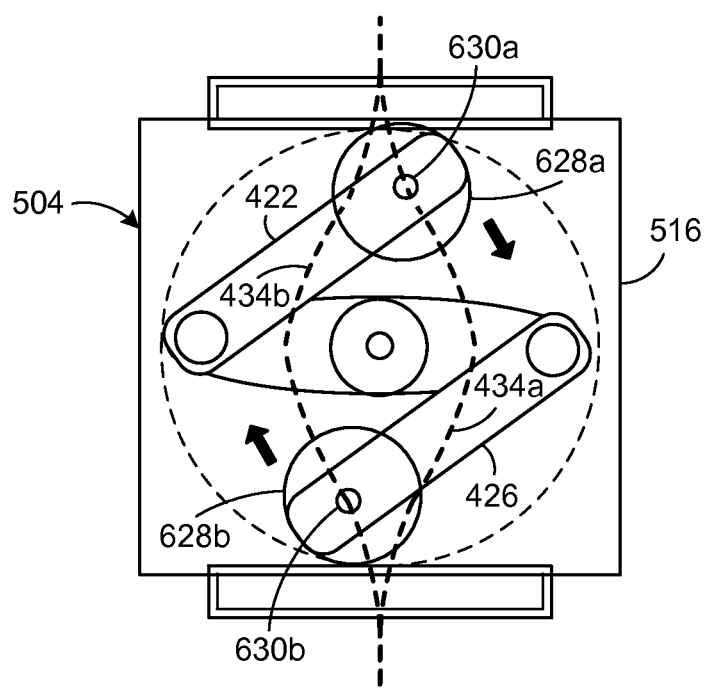
Figure 6C:
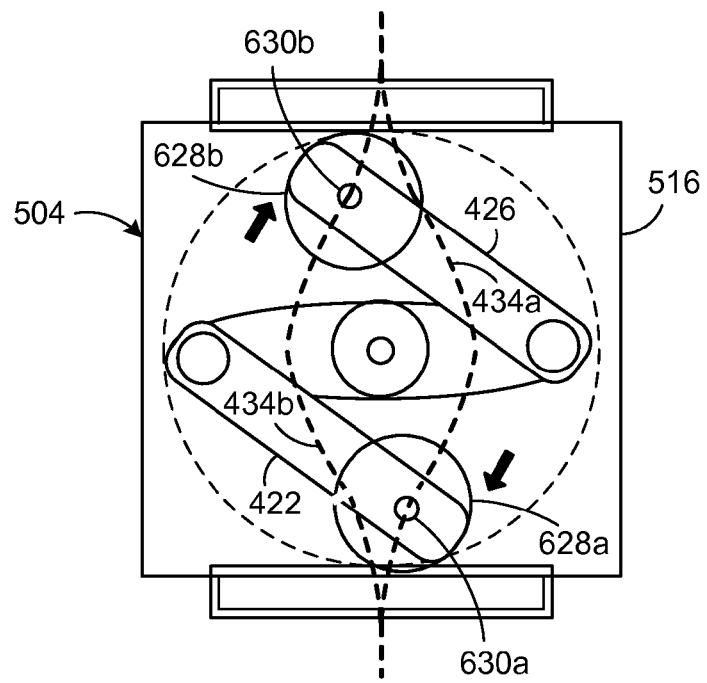
Figure 6D:
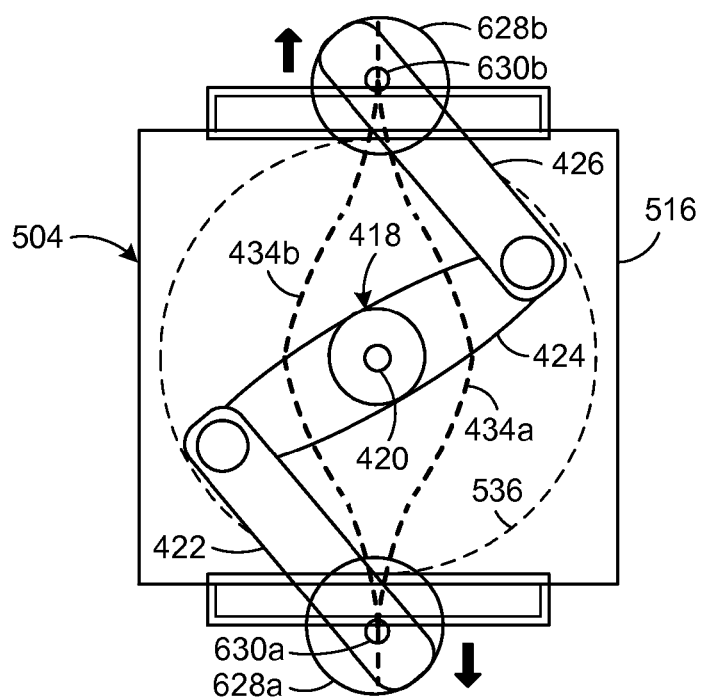

FIG. 5 illustrates a semiconductor processing system 500 that may include processing chamber 102, a wafer handling system 504, and load lock chamber 106 in accordance with one or more embodiments. A slit valve 508 or similar device may couple processing chamber 102 to wafer handling system 504 to allow a wafer to be transferred there between. A slit valve 510 or similar device may couple load lock chamber 106 to wafer handling system 504 to allow a wafer to be transferred there between. Slit valves 508 and/or 510 may be smaller than respective slit valves 108 and/or 110 of semiconductor processing system 100 (FIG. 1). In other embodiments, semiconductor processing system 500 may alternatively or additionally include other types of chambers coupled to wafer handling system 504.

Wafer handling system 504 may include a transfer chamber 516 and robot 418. Robot 418 may include first arm 422, second arm 424, and third arm 426, as described above. Center axis 420, about which robot 418 may rotate, may be located at the center of second arm 424 and may be positioned at the center of transfer chamber 516. First arm 422 of robot 418 may extend into processing chamber 102 to deliver or retrieve a wafer to or from wafer position 114a. Third arm 426 may extend into load lock chamber 106 to deliver or retrieve a wafer 528. Wafer 528 may be, e.g., a 300 mm wafer. Robot 418 may be configured to concurrently exchange a pair of wafers between the same two chambers. For example, robot 418 may be configured to concurrently swap the positions of one wafer located at wafer position 114a in processing chamber 102 and another wafer located in load lock chamber 106. Robot 418 may be configured to move one wafer along first nonlinear trajectory 434a and another wafer along second nonlinear trajectory 434b. First trajectory 434a and second trajectory 434b are located between the same two chambers. Furthermore, robot 418 may be configured to concurrently move one wafer along first nonlinear trajectory 434a and another wafer along second nonlinear trajectory 434b between the same two chambers.

FIGS. 6A-D illustrate the movements of a wafer 628a carried by first arm 422 and a wafer 628b carried by third arm 426 in accordance with one or more embodiments. During wafer exchanges, robot 418 may move the center 630a of wafer 628a carried by first arm 422 along first nonlinear trajectory 434a and may concurrently move the center 630b of wafer 628b carried by third arm 426 along second nonlinear trajectory 434b. As shown, wafer 628a may move downward along first nonlinear trajectory 434a, while wafer 628b may move upward along second nonlinear trajectory 434b. These movements may be concurrent. Note that first arm 422 may be positioned higher or lower than third arm 426 such that wafers 628a and 628b may pass each other along their respective nonlinear trajectories 434a and 434b without interfering with each other. Because of the geometries of first arm 422, second arm 424, and third arm 426 as described above, robot 418 may be configured to move a wafer such that the center of the wafer moves along a curved trajectory about the center of second arm 424, which coincides with center axis 420. As wafers are transferred from one chamber to another, robot 418 may sweep out across an envelope 536 that may have a much smaller volume than that of envelop 136 of robot 118. As a result, transfer chamber 516 may be much smaller than transfer chamber 116 of semiconductor processing system 100 (FIG. 1).

In some embodiments, the area of transfer chamber 516 may be, e.g., 45-50% less than the area of transfer chamber 116. In some embodiments, a longitudinal length L516 and/or a transverse width W516 of transfer chamber 516 may be, e.g., 25-30% less than a longitudinal length L116 and/or a transverse width W116 of transfer chamber 116. These reductions in transfer chamber area, longitudinal length, and/or transverse width may decrease the overall footprint of a semiconductor processing system, which may reduce the cost of manufacture. Furthermore, smaller envelop 536 may also allow smaller chamber openings and smaller slit valves to be used in some embodiments than those used in semiconductor processing system 100 (FIG. 1). Still further, wafer handling system 504 may be usable with standard 300 mm interfaces and other standard designs.

Figure 7:
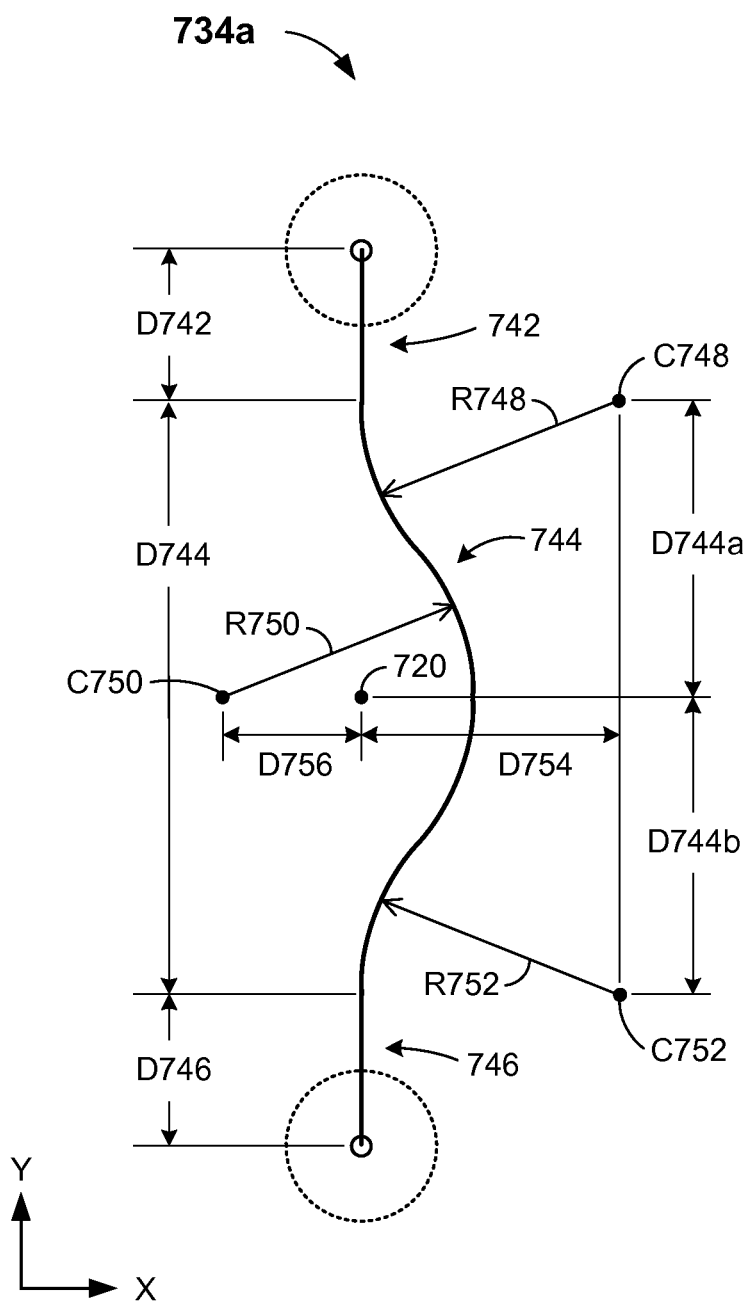
FIG. 7 illustrates a schematic top view of a motion trajectory for a wafer transfer robot according to embodiments.

FIG. 7 illustrates an example nonlinear trajectory 734a that a wafer transfer robot may be configured to use in accordance with one or more embodiments. Nonlinear trajectory 734a may include a first linear portion 742 having a first distance D742, a curved portion 744 around the center of the second arm (which coincides with center axis 720) having a second distance D744, and a second linear portion 746 having a third distance D746. Second distance D744, which extends linearly as shown, may be the sum of a distance D744a and a distance D744b. Curved portion 744 may be configured as shown to have a first radius of curvature R748, a second radius of curvature R750, and a third radius of curvature R752. Referring to the X-Y axes shown in FIG. 7, first radius of curvature R748 may have a center of curvature C748 located at a +X-distance D754 and a +Y-distance D744a from center axis 720. Second radius of curvature R750 may have a center of curvature C750 located a −X-distance D756 from center axis 720. And third radius of curvature R752 may have a center of curvature C752 located at a +X-distance D754 and a −Y-distance D744b from center axis 720.

In some embodiments, first distance D742 and third distance D746 may each be about 353.8 mm (about 13.9 inches); second distance D744 may be about 1099 mm (about 43.3 inches); distances D744a and D744b may each be about 549.5 mm (about 21.6 inches); distance D754 and radii of curvatures R748, R750, and R752 may each be about 533.4 mm (about 21 inches); and distance D756 may be about 381 mm (about 15 inches). Other suitable distances and/or radii of curvatures may be used in other embodiments, depending on the lengths of first arm 422, second arm 424, and third arm 426.

A corresponding second nonlinear trajectory that may be used along with nonlinear trajectory 734a in the same wafer transfer robot may be configured similarly as nonlinear trajectory 734a (but on the opposite side of the Y-axis intersecting center axis 720).

Figure 8:
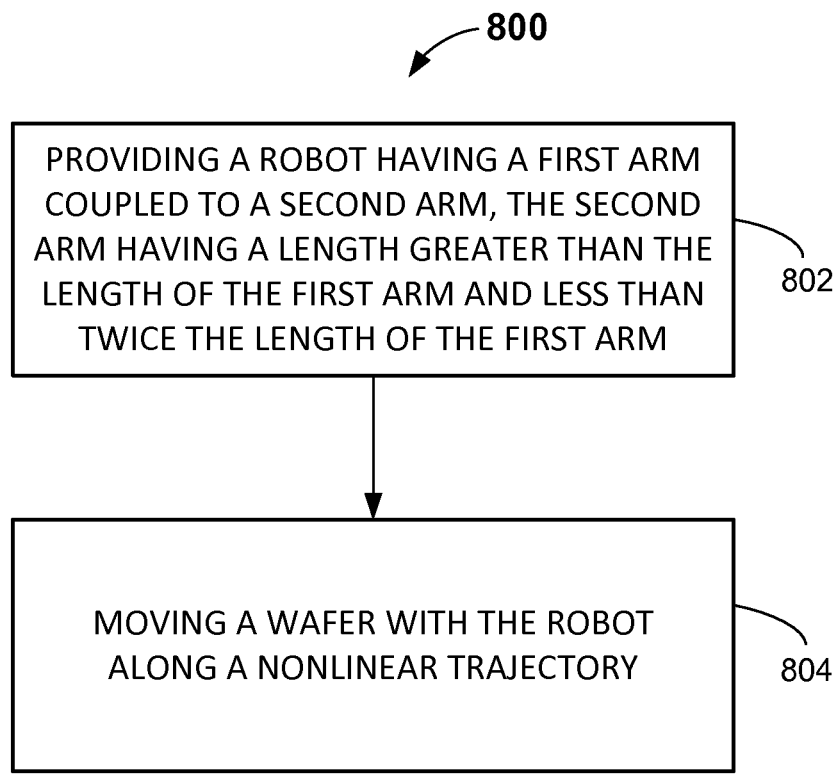
FIG. 8 illustrates a flowchart of a method of transferring wafers in a semiconductor processing system according to embodiments.

FIG. 8 illustrates a method 800 of transferring wafers in a semiconductor processing system in accordance with one or more embodiments. At process block 802, method 800 may include providing a robot having a first arm and a second arm, wherein the first arm has a first length and the second arm has a second length greater than the first length and less than twice the first length. For example, in some embodiments, the first arm may have a length of about 533.4 mm (about 21 inches) while the second arm may have a length of about 762 mm (about 30 inches). In some embodiments, the first arm may be an upper arm of the robot while the second arm may be a lower arm of the robot (or vice versa in other embodiments). The first arm may be rotatably coupled to an end of the second arm. Referring to FIG. 4, the first arm may be, e.g., first arm 422 and the second arm may be, e.g., second arm 424. In some embodiments, the robot may also have a third arm having a third length, wherein the second length of the second arm is greater than the third length and less than twice the third length. The third arm may be rotatably coupled to a second end of the second arm. Again referring to FIG. 4, the third arm may be, e.g., third arm 426.

At process block 804, method 800 may include moving a first wafer with the robot such that the center of the first wafer moves along a nonlinear trajectory. In some embodiments, a wafer may be moved with the robot such that the center of the wafer moves along a first linear portion of the nonlinear trajectory for a first distance, along a curved portion of the nonlinear trajectory around the center of the second arm for a second distance, and along a second linear portion of the nonlinear trajectory for a third distance. In some embodiments, a second wafer may be moved with the robot concurrently with the first wafer such that the center of the second wafer moves along a second nonlinear trajectory, wherein the first wafer and the second wafer may move concurrently between the same two chambers.

Persons skilled in the art should readily appreciate that the invention described herein is susceptible of broad utility and application. Many embodiments and adaptations of the invention other than those described herein, as well as many variations, modifications, and equivalent arrangements, will be apparent from, or reasonably suggested by, the invention and the foregoing description thereof, without departing from the substance or scope of the invention. For example, although described in connection with semiconductor processing systems, one or more embodiments of the invention may be used with other types of systems that move parts via a robot from one location to another. Accordingly, while the invention has been described herein in detail in relation to specific embodiments, it should be understood that this disclosure is only illustrative and presents examples of the invention and is made merely for purposes of providing a full and enabling disclosure of the invention. This disclosure is not intended to limit the invention to the particular apparatus, devices, assemblies, systems or methods disclosed, but, to the contrary, the intention is to cover all modifications, equivalents, and alternatives falling within the scope of the invention, as defined by the following claims.

What is claimed is:
1. A wafer handling system, comprising:
a robot including a first arm having a first length and a second arm having a second length greater than the first length and less than twice the first length, the second arm rotatable about its center;

wherein the robot is configured to move a wafer such that the center of the wafer moves along a nonlinear trajectory.

2. The wafer handling system of claim 1, wherein the first arm is an upper arm and the second arm is a lower arm.

3. The wafer handling system of claim 1, wherein the robot is configured to move a wafer such that the center of the wafer moves along a curved trajectory about the center of the second arm.

4. The wafer handling system of claim 1, wherein the first arm is rotatably coupled to a first end of the second arm.

5. The wafer handling system of claim 1, wherein the first arm is configured to carry a wafer.

6. The wafer handling system of claim 1, further comprising a third arm having a third length, wherein the second length is greater than the third length and less than twice the third length.

7. The wafer handling system of claim 6, wherein the third arm is rotatably coupled to a second end of the second arm.

8. The wafer handling system of claim 6, wherein the third arm is configured to carry a wafer.

9. The wafer handling system of claim 6, wherein the robot is configured to move a first wafer carried by the first arm such that the center of the first wafer moves along a first nonlinear trajectory and concurrently move a second wafer carried by the third arm such that the center of the second wafer moves along a second nonlinear trajectory, the first nonlinear trajectory located between two chambers and the second nonlinear trajectory located between the same two chambers.

10. A semiconductor processing system, comprising:
a first chamber configured to receive one or more wafers;
a second chamber configured to receive one or more wafers; and
a robot located between the first chamber and the second chamber, the robot including a first arm having a first length and a second arm having a second length greater than the first length and less than twice the first length, the second arm rotatable about its center; wherein:
the robot is configured to move a wafer to or from the first chamber and from or to the second chamber such that the center of the wafer moves along a nonlinear trajectory between the first chamber and the second chamber.

11. The semiconductor processing system of claim 10, wherein the robot is configured to move a wafer to or from the first chamber and from or to the second chamber such that the center of the wafer moves along a first linear portion of the nonlinear trajectory for a first distance, along a curved portion of the nonlinear trajectory around the center of the second arm for a second distance, and along a second linear portion of the nonlinear trajectory for a third distance.

12. The semiconductor processing system of claim 10, wherein the first arm is rotatably coupled to a first end of the second arm and is configured to carry a wafer.

13. The semiconductor processing system of claim 10, further comprising a third arm having a third length, wherein:
the second length is greater than the third length and less than twice the third length;
the third arm is rotatably coupled to a second end of the second arm; and
the third arm is configured to carry a wafer.

14. The semiconductor processing system of claim 10, wherein the first chamber is a processing chamber and the second chamber is a load lock chamber.

15. The semiconductor processing system of claim 10, wherein the robot further includes a third arm having a third length, wherein the second length is greater than the third length and less than twice the third length, and the robot is configured to move a first wafer carried by the first arm such that the center of the first wafer moves along a first nonlinear trajectory and concurrently move a second wafer carried by the third arm such that the center of the second wafer moves along a second nonlinear trajectory, the robot configured to move first wafer and the second wafer concurrently between the first chamber and the second chamber.

16. A method of transferring wafers in a semiconductor processing system, comprising:
providing a robot configured to transfer a first wafer, the robot comprising a first arm coupled to a second arm, wherein the first arm has a first length and the second arm has a second length greater than the first length and less than twice the first length, the second arm rotatable about its center; and
moving the first wafer with the robot such that the center of the first wafer moves along a nonlinear trajectory.

17. The method of claim 16, wherein the moving the first wafer comprises:
moving the first wafer with the robot such that the center of the first wafer moves along a first linear portion of the nonlinear trajectory for a first distance;
moving the first wafer with the robot such that the center of the first wafer moves along a curved portion of the nonlinear trajectory around the center of the second arm for a second distance; and
moving the first wafer with the robot such that the center of the first wafer moves along a third linear portion of the nonlinear trajectory for a third distance.

18. The method of claim 16, wherein the providing a robot further comprises providing a robot comprising a third arm having a third length, wherein the second length of the second arm is greater than the third length and less than twice the third length.

19. The method of claim 16, wherein the moving the first wafer comprises moving the first wafer with the robot such that the center of the first wafer moves along a curved trajectory from a first chamber to a second chamber.

20. The method of claim 16, further comprising moving a second wafer concurrently with the first wafer with the robot such that the center of the second wafer moves along a second nonlinear trajectory, the first wafer moving between two chambers and the second wafer moving concurrently between the same two chambers.

* * * * *